(12) United States Patent
Jaussi

(10) Patent No.: US 6,825,724 B2
(45) Date of Patent: Nov. 30, 2004

(54) AMPLIFIER AND METHOD FOR PROCESSING SIGNALS

(75) Inventor: James E. Jaussi, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/320,587

(22) Filed: Dec. 16, 2002

(65) Prior Publication Data

US 2004/0113693 A1 Jun. 17, 2004

(51) Int. Cl.[7] .............................. H03F 3/45; H03F 1/08
(52) U.S. Cl. ..................................... 330/260; 330/293
(58) Field of Search ................................... 330/260, 293

(56) References Cited

U.S. PATENT DOCUMENTS

| | | | | |
|---|---|---|---|---|
| 4,479,202 A | * | 10/1984 | Uchida | .................. 365/190 |
| 5,600,280 A | * | 2/1997 | Zhang | .......................... 331/57 |
| 5,955,899 A | * | 9/1999 | Afghahi | ........................ 327/65 |
| 5,966,050 A | * | 10/1999 | Yoshino et al. | ............. 330/255 |
| 6,054,897 A | | 4/2000 | Sugawara | .................... 330/252 |
| 6,188,282 B1 | | 2/2001 | Montalvo | .................... 330/260 |
| 2003/0025562 A1 | * | 2/2003 | Andreou et al. | |

* cited by examiner

Primary Examiner—Patricia Nguyen
(74) Attorney, Agent, or Firm—Schwegman, Lundberg, Woessner & Kluth, P.A.

(57) ABSTRACT

An amplifier includes a differential pair including a pair of input ports and a pair of output ports and a nonlinear load coupled to the differential pair. The pair of output ports is coupled to the pair of input ports to provide negative feedback. The pair of output ports is coupled to the nonlinear load to provide positive feedback. A method includes receiving a signal at an input port of an amplifier and processing the signal in the amplifier by coupling negative feedback and positive feedback produced in the amplifier by the signal to the input port.

18 Claims, 3 Drawing Sheets

AMPLIFIER AND METHOD FOR PROCESSING SIGNALS

FIELD

This invention relates to amplifiers and more particularly to amplifiers that include a nonlinear load.

BACKGROUND

Amplifiers, such as linear amplifiers having multiple linear gain stages, are used to process signals. These amplifiers perform two important tasks. First, they increase the amplitude of some frequency components of the original signal contained in the received signal. Second, they decrease the amplitude of other frequency components (sometimes noise frequencies) contained in the received signal. For signal transmission systems that process low speed digital signals, these amplifiers perform adequately. However, to successfully process high speed digital signals, such as those used in modern information processing and communication systems, amplifiers must have a large gain-bandwidth product. Unfortunately, linear amplifiers having multiple stages often do not have a sufficiently large gain-bandwidth product to process the signals used in high speed digital systems.

DESCRIPTION

Figure 1A:
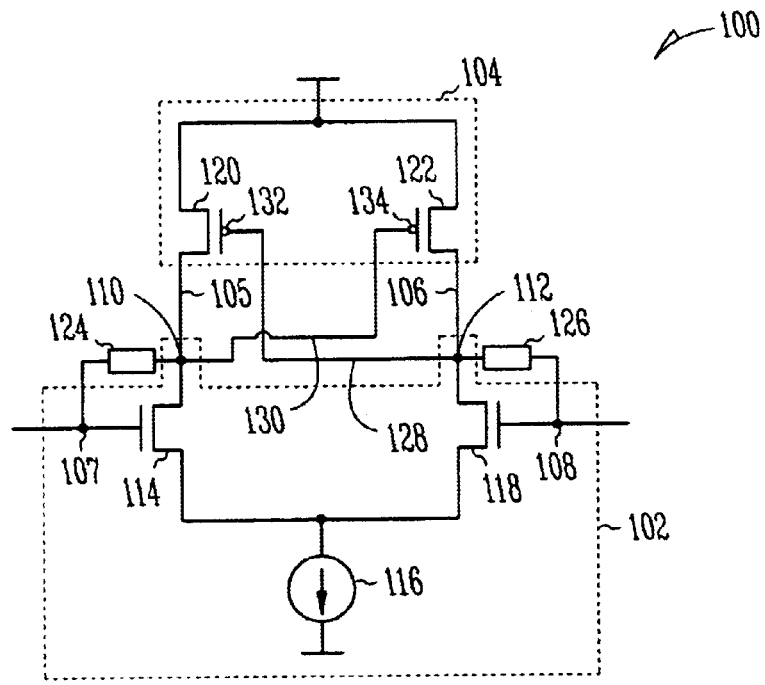
FIG. 1A is a schematic diagram of an amplifier in accordance with one embodiment of the invention.

In the following detailed description of some embodiments of the invention, reference is made to the accompanying drawings which form a part hereof, and in which are shown, by way of illustration, specific embodiments of the invention which may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

FIG. 1A is a schematic diagram of an amplifier 100 in accordance with one embodiment of the invention. The amplifier 100 includes a differential pair 102 and a nonlinear load 104 coupled to the differential pair 102 through interconnects 105 and 106. The differential pair 102 includes a pair of input ports 107 and 108 and a pair of output ports 110 and 112. The pair of output ports 110 and 112 is coupled to the pair of input ports 107 and 108 to provide negative feedback in the amplifier 100. The use of negative feedback reduces the sensitivity of the amplifier 100 to open loop gain variations. The pair of output ports 110 and 112 is cross-coupled to the nonlinear load 104 to provide positive feedback in the amplifier 100. The use of positive feedback can cause an amplifier to become unstable, but setting the direct-current gain of the amplifier 100 to less than one stabilizes the amplifier 100. The use of positive feedback increases the gain-bandwidth product of the amplifier 100. Increasing the gain-bandwidth product of the amplifier 100 makes the amplifier 100 suitable for use in connection with applications that require processing of fast rise time signals, such as the signals encountered in digital signaling applications. Digital signaling applications include sending and receiving of digital signals on a single die and among dice in a digital or mixed signal system.

The differential pair 102 includes a first insulated gate field-effect transistor 114 coupled to a current source 116 and a second insulated gate field-effect transistor 118 coupled to the current source 116. In operation, the differential pair 102 receives a signal (such as a voltage signal from a voltage source in series with an impedance) at each of the pair of input ports 107 and 108 and divides the current provided by the current source 116 between the first insulated gate field-effect transistor 114 and the second insulated gate field-effect transistor 118. Thus, the output signal at the pair of output ports 110 and 112 depends only on the difference between the input signals at the pair of input ports 107 and 108. The nonlinear load 104 includes a pair of insulated gate field-effect transistors 120 and 122. The pair of insulated gate field-effect transistors 120 and 122 receives a feedback signal from the pair of output ports 110 and 112 and delivers positive feedback to the pair of input ports 107 and 108. The positive feedback, as noted above, improves the gain-bandwidth product of the amplifier 100.

The transistors used in the fabrication of the amplifier 100 are not limited to transistors of a single conductivity type. For example, in one embodiment, the first insulated gate field-effect transistor 114 and the second insulated gate field-effect transistor 118 are formed from materials including a first conductivity type, and the pair of insulated gate field-effect transistors 120 and 122 are formed from materials including a second conductivity type that is different from the first conductivity type. For example, in one embodiment, the first conductivity type is n-type and the second conductivity type is p-type. Thus, the first insulated gate field-effect transistor 114 and the second insulated gate field-effect transistor 118 are formed from materials having n-type conductivity, and the pair of insulated gate field-effect transistors 120 and 122 are formed from materials having p-type conductivity. Materials having n-type conductivity are formed by the addition of dopants to a host material where the dopants have a valency one more than the host atom. For example, n-type silicon is formed by adding elements such as arsenic, phosphorus, or antimony to silicon. Materials having p-type conductivity are formed by the addition of dopants to a host material where the dopants have a valency of one less than the host atom. For example, p-type silicon is formed by adding elements such as boron, aluminum, gallium, or indium to silicon.

Figure 1B:
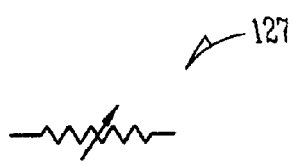
FIG. 1B is a schematic diagram of a variable resistor suitable for use in connection with the amplifier shown in FIG. 1A in accordance with another embodiment of the invention.

The topology of the amplifier 100 is not limited to a particular arrangement of transistors and resistors. In one embodiment, each of the pair of output ports 110 and 112 is coupled to one of the pair of input ports 107 and 108 through resistors 124 and 126 to provide negative feedback in the amplifier 100. The resistors 124 and 126 are illustrated as fixed value resistors, but the resistors 124 and 126 are not limited to fixed value resistors. FIG. 1B is a schematic diagram of a variable resistor 127 suitable for use in connection with the amplifier 100 shown in FIG. 1A in accordance with another embodiment of the invention. The variable resistor 127 is not limited to a particular type of variable resistor. Optical devices, microelectromechanical system (MEMS) devices, and electrical devices are suitable for use as variable resistors in connection with the amplifier 100 (shown in FIG. 1A).

Figure 1C:
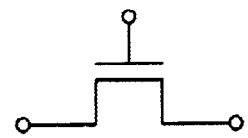
FIG. 1C is a schematic diagram of an electrical device suitable for use as the variable resistor shown in FIG. 1B in accordance with another embodiment of the invention.

FIG. 1C is a schematic diagram of an electrical device suitable for use as the variable resistor 127 shown in FIG. 1B in accordance with another embodiment of the invention. The electrical device includes an insulated gate field-effect transistor having a gate and a channel. An electrical signal is applied to the gate to control the conductance and thus the resistance of the channel in the insulated gate field effect transistor shown in FIG. 1C.

Referring again to FIG. 1A, in another embodiment, each of the pair of output ports 110 and 112 is coupled through an interconnect 128 or 130 having substantially zero resistance to a gate 132 or 134 of one of the pair of insulated gate field-effect transistors 120 and 122 of the nonlinear load 104. Substantially zero resistance can be obtained from a variety of interconnect materials. Exemplary materials suitable for use in connection with the fabrication of the interconnects 128 and 130 include aluminum, alloys of aluminum, copper, alloys of copper, and polysilicon.

Figure 1D:
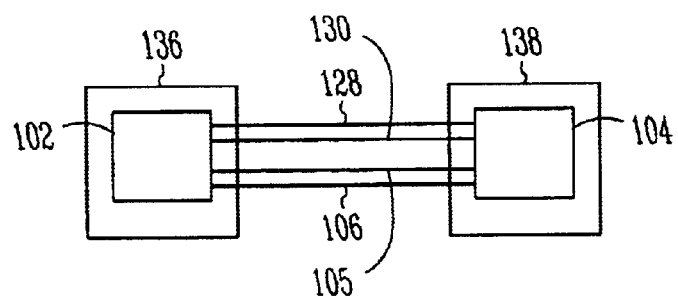
FIG. 1D is a block diagram of the differential pair shown in FIG. 1A and formed on a first substrate and coupled to a nonlinear load shown in FIG. 1A and formed on a second substrate in accordance with another embodiment of the invention.

FIG. 1D is a block diagram of the differential pair 102 (shown in FIG. 1A) formed on a first substrate 136 and coupled to a nonlinear load 104 (shown in FIG. 1A) formed on a second substrate 138 in accordance with another embodiment of the invention. Thus, the amplifier 100 (shown in FIG. 1A) including the differential pair 102 and the nonlinear load 104 is not limited to being fabricated on a single substrate. In addition, the first substrate 136 and the second substrate 138 are not limited to being fabricated from a particular material. Exemplary materials suitable for use in connection with the fabrication of the first substrate 136 and the second substrate 138 include silicon, silicon-on-insulator, silicon-on-sapphire, germanium, gallium arsenide, and indium phosphide. Furthermore, the first substrate 136 and the second substrate 138 are not limited to being fabricated from the same material. For example, the first substrate 136 can be fabricated from silicon, and the second substrate can be fabricated from silicon-on-sapphire. Alternately, the first substrate can be fabricated from silicon, and the second substrate can be fabricated from gallium arsenide.

The differential pair 102 is coupled to the nonlinear load 104 through the interconnects 128 and 130 and through the interconnects 105 and 106. The interconnects 105 and 106 couple a gate/source of each of the first insulated gate field-effect transistors 114 and 118 (shown in FIG. 1A) to a gate/source of each of the pair of insulated gate field-effect transistors 120 and 122 (shown in FIG. 1A), respectively.

Figure 2:
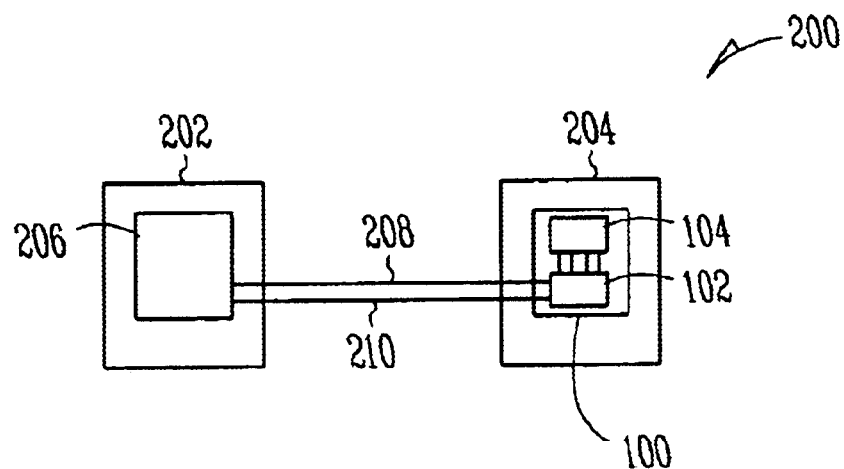
FIG. 2 is a block diagram of a communication unit including a first die and a second die in accordance with another embodiment of the invention.

FIG. 2 is a block diagram of a communication unit 200 including a first die 202 and a second die 204 in accordance with another embodiment of the invention. The first die 202 includes the driver circuit 206, and the second die 204 includes the amplifier 100 (shown in more detail in FIG. 1A). The amplifier 100 includes the differential pair 102 (shown in more detail in FIG. 1A) coupled to the nonlinear load 104 (shown in more detail in FIG. 1A). The amplifier 100 is coupled to the driver circuit 206 through the interconnects 208 and 210. The driver circuit 206 is selected to have a drive capability sufficient to drive the interconnects 208 and 210 at a level that provides a signal to the amplifier 100 that meets the input requirements of the amplifier 100.

The communication unit 200 is not limited to use in connection with a nonlinear load having a particular configuration. In one embodiment, the nonlinear load 104 (shown in more detail in FIG. 1A) includes a pair of insulated gate field-effect transistors 120 and 122, and the amplifier 100 (shown in more detail in FIG. 1A) includes a pair of output ports 110 and 112 in which each of the pair of output ports 110 and 112 is cross-coupled to a gate of one of the pair of insulated gate field-effect transistors 120 and 122. In an alternate embodiment, the insulated gate field effect transistors 120 and 122 of the nonlinear load 104 are p-type insulated gate field-effect transistors. The communication unit 200 is not limited to use in connection with a differential pair having a particular feedback configuration. In one embodiment, the differential pair 102 (shown in more detail in FIG. 1A) includes a first insulated gate field-effect transistor 114 and a second insulated gate field-effect transistor 118 and a pair of output ports 110 and 112 in which each of the pair of output ports 110 and 112 is coupled through a resistor 124 or 126 to a gate of either the first insulated gate field-effect transistor 114 or the second insulated gate field-effect transistor 118.

Neither the first die 202 nor the second die 204 is limited to being fabricated from a particular material. Exemplary materials suitable for use in the fabrication of the first die 202 and the second die 204 include semiconductors such as silicon and gallium arsenide. In one embodiment, the first die 202 is fabricated from silicon and the second die 204 is fabricated from silicon. However, the first die 202 and the second die 204 are not limited to being fabricated from the same material. For example, in an alternate embodiment, the first die 202 is fabricated from gallium arsenide and the second die 204 is fabricated from silicon.

Figure 3:
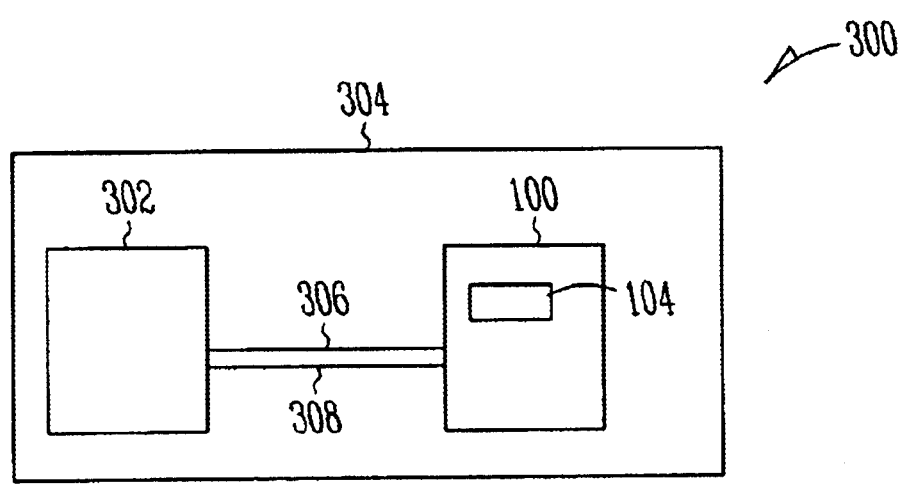
FIG. 3 is a block diagram of an information processing unit in accordance with another embodiment of the invention.

FIG. 3 is a block diagram of an information processing unit 300 in accordance with another embodiment of the invention. The information processing unit 300 includes a processor 302 formed on a die 304 and an amplifier 100 (shown in more detail in FIG. 1A) formed in the die 304. The processor 302 is coupled to the amplifier 100 through the interconnects 306 and 308. The amplifier includes a nonlinear load 104 (shown in FIG. 1A) to provide positive feedback in the amplifier 100. The information processing unit 300 is not limited to use in connection with a particular type of processor. In one embodiment the processor 302 includes a reduced instruction set processor. In an alternate embodiment the processor 302 includes a very long instruction word processor. The information processing unit 300 is also not limited to use in connection with a die formed from a particular material. In one embodiment, the die 304 includes a silicon substrate. In an alternate embodiment, the die 304 includes a gallium arsenide substrate.

Figure 4:
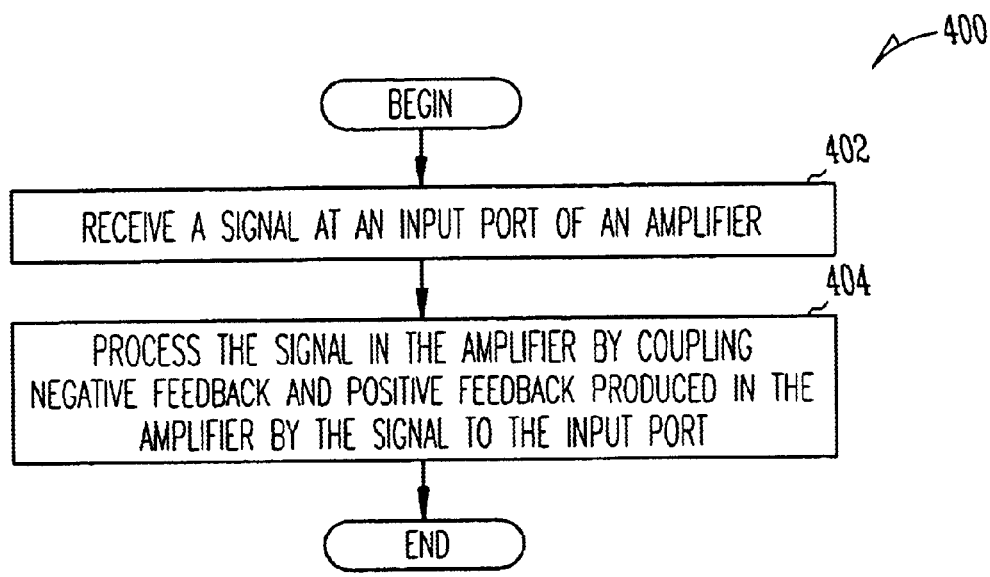
FIG. 4 is a flow diagram of a method for processing a signal in accordance with still another embodiment of the invention.

FIG. 4 is a flow diagram of a method 400 for processing a signal in accordance with still another embodiment of the invention. The method 400 includes receiving a signal at an input port of an amplifier (block 402) and processing the signal in the amplifier by coupling negative feedback and positive feedback produced in the amplifier by the signal to the input port (block 404). Including positive feedback can cause an amplifier to be unstable, but for amplifier 100 (shown in FIG. 1A) the direct-current gain is set to less than one, so the amplifier 100 is stable. In an alternate embodiment, processing the signal in the amplifier by coupling negative feedback and positive feedback to the input port includes coupling an output port of the amplifier through a resistor to the input port and driving a pair of insulated gate field-effect transistors from the output port. In another alternate embodiment, receiving the signal at the input port of the amplifier includes receiving a differential signal at the input port. In still another alternate embodiment, driving the pair of insulated gate field-effect transistors from the output port includes driving the pair of insulated gate field-effect transistors with a differential signal.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the present invention. Therefore, it is intended that this invention be limited only by the claims and the equivalents thereof.

What is claimed is:

1. An amplifier comprising:
    a differential pair including a pair of input ports and a pair of output ports; and
    a nonlinear load coupled to the differential pair, wherein the pair of output ports is coupled to the pair of input ports to provide negative feedback and cross-coupled to the non-linear load to provide positive feedback, wherein the differential pair comprises a first insulated gate field-effect transistor coupled to a current source and a second insulated gate field-effect transistor coupled to the current source, the first insulated gate field-effect transistor and the second insulated gate field-effect transistor each include a first conductivity type, and the nonlinear load includes a pair of insulated gate field-effect transistors each of which includes a second conductivity type, each of the pair of output ports is coupled to one of the pair of input ports through a resistor, the first conductivity type is n-type and the second conductivity type is p-type, and the resistor comprises a variable resistor.

2. The amplifier of claim 1, wherein the variable resistor comprises an insulated gate field-effect transistor.

3. An amplifier comprising:
    a differential pair including a pair of input ports and a pair of output ports; and
    a nonlinear load coupled to the differential pair, wherein the pair of output ports is coupled to the pair of input ports to provide negative feedback and cross-coupled to the non-linear load to provide positive feedback, wherein the differential pair is formed on a first substrate and the nonlinear load is formed on a second substrate.

4. An amplifier comprising:
    a differential pair including a pair of n-type insulated gate field-effect transistors and a current source coupled to the pair of n-type insulated gate field-effect transistors which provide an input port and an output port for the differential pair;
    a pair of cross-coupled p-type insulated gate field-effect transistors coupled to the output port of the differential pair; and
    a pair of feedback resistors to couple the output port to the input port, wherein the amplifier has a direct-current gain of less than one.

5. The amplifier of claim 4, wherein the amplifier is formed on a single die.

6. A communication unit comprising:
    a first die including a driver circuit; and
    a second die including an amplifier coupled to the driver circuit, the amplifier comprising a differential pair and a nonlinear load coupled to the differential pair and the amplifier including negative feedback and positive feedback.

7. The communication unit of claim 6, wherein the nonlinear load includes a pair of insulated gate field-effect transistors and the amplifier includes a pair of output ports in which each of the pair of output ports is coupled to a gate of one of the pair of insulated gate field-effect transistors.

8. The communication unit of claim 7, wherein the differential pair includes a pair of insulated gate field-effect transistors and each of the pair of output ports is coupled through a resistor to a gate of one of the pair of insulated gate field-effect transistors.

9. The communication unit of claim 6, wherein the first die comprises a silicon substrate.

10. The communication unit of claim 7, wherein the second die comprises a silicon substrate.

11. The communication unit of claim 6, wherein the first die comprises a semiconductor substrate.

12. The communication unit of claim 7, wherein the semiconductor substrate comprises a gallium arsenide substrate.

13. The communication unit of claim 12, wherein the second die comprises a silicon substrate.

14. The communication unit of claim 6, wherein the non-linear load comprises a pair of p-type insulated gate field-effect transistors.

15. An information processing unit comprising:
    a processor formed on a die; and
    an amplifier formed on the die and coupled to the processor, the amplifier including a nonlinear load to provide positive feedback in the amplifier, wherein the processor comprises a reduced instruction set processor.

16. The information processing unit of claim 15, wherein the die comprises a silicon substrate.

17. An information processing unit comprising:
    a processor formed on a die; and
    an amplifier formed on the die and coupled to the processor, the amplifier including a nonlinear load to provide positive feedback in the amplifier, wherein the processor comprises a very long instruction word processor.

18. The information processing unit of claim 17, wherein the die comprises a gallium arsenide substrate.

* * * * *